US006733946B2

(12) United States Patent
Kumacheva et al.

(10) Patent No.: US 6,733,946 B2
(45) Date of Patent: May 11, 2004

(54) THREE DIMENSIONAL OPTICAL MEMORY STORAGE

(75) Inventors: Eugenia Kumacheva, Toronto (CA); Olga Kalinina, Toronto (CA); Robert John Dwayne Miller, Port Credit (CA); Bradley John Siwick, Toronto (CA); James Harry Sharp, Burlington (CA); Jaan Noolandi, Mississauga (CA)

(73) Assignees: Xerox Corporation, Stamford, CT (US); University of Toronto, Toronto (CA)

( * ) Notice: Subject to any disclaimer, the term of this patent is extended or adjusted under 35 U.S.C. 154(b) by 195 days.

(21) Appl. No.: 09/801,712

(22) Filed: Mar. 9, 2001

(65) Prior Publication Data

US 2001/0043495 A1 Nov. 22, 2001

Related U.S. Application Data

(60) Provisional application No. 60/187,951, filed on Mar. 9, 2000.

(51) Int. Cl.[7] .................................................. G11B 7/24
(52) U.S. Cl. ...................... 430/138; 430/945; 430/962; 428/141
(58) Field of Search ................................ 430/138, 945, 430/962; 428/141

(56) References Cited

U.S. PATENT DOCUMENTS

| 4,948,695 A | | 8/1990 | Matsushita et al. ......... 430/138 |
| 5,013,629 A | | 5/1991 | Sekine et al. ............... 430/138 |
| 5,026,590 A | * | 6/1991 | Nakajima et al. ........... 428/141 |
| 5,034,613 A | | 7/1991 | Denk et al. ................. 356/318 |
| 5,268,862 A | | 12/1993 | Rentzepis .................... 365/151 |
| 5,289,407 A | | 2/1994 | Strickler et al. ............ 365/106 |
| 5,325,324 A | | 6/1994 | Rentzepis et al. .......... 365/127 |
| 5,694,249 A | | 12/1997 | Misawa ....................... 359/620 |
| 5,952,131 A | | 9/1999 | Kumacheva et al. ........ 480/138 |

| 6,303,259 B1 | * | 10/2001 | Kubo et al. ................. 430/138 |

FOREIGN PATENT DOCUMENTS

| JP | 63-169638 | 7/1988 |
| WO | WO 98/53448 | 11/1998 |

OTHER PUBLICATIONS

Kalinina et al., "A 'Core–Shell' Approach to Producing 3D polymer nanocomposites", Macromolecules, vol. 32 (1999) pp, 4122–4129.*
K.J. O'Callaghan et al., "Mixed Initiator Approach to the Surfactant–Free Semicontinuous Emulsion Polymerization of Large MMA/BA Particles", Journal of Applied Polymer Science, vol. 58, pp. 2047–2055, 1995.
Zhiyu Wang et al., "Control of Surfactant Level in Starve–Fed Emulsion Polymerization. I. Sulfate–Containing Oligomers: Preparation and Application as Surfactant in Emulsion Polymerization", Journal of Polymer Science, vol. 33, pp. 1597–1606, 1995.
U.S. Provisional Application No. 60/187,951.
E. Kumacheva et al., *Three Dimensional Arrays in Polymer Nanocomposites*, Adv. Mater., 1999, 11, No. 3, p. 231–234.

* cited by examiner

*Primary Examiner*—Martin J Angebranndt
(74) *Attorney, Agent, or Firm*—Oliff & Berridge, PLC; Eugene O. Palazzo

(57) ABSTRACT

A method for providing three dimensional optical memory storage for computers. The method comprises subjecting a nanocomposite to irradiation. The nanocomposite comprises a matrix of particles of a liquid core resin within an inner shell resin and an outer shell resin. The inner shell resin retains the liquid core resin while the outer shell resin forms a continuous phase of the matrix. The particles of core resin contain at least one photosensitive compound and are in an array in the matrix. The continuous phase is substantially free of photosensitive compound. The irradiation may be a single beam of irradiation selectively focused on individual particles in the array to effect photobleaching of individual particles or a two-photon irradiation of a wavelength to effect photobleaching.

19 Claims, 4 Drawing Sheets

THREE DIMENSIONAL OPTICAL MEMORY STORAGE

This application claims the benefit of U.S. Provisional Application No. 60/187,951, filed Mar. 9, 2000.

FIELD OF THE INVENTION

The present invention relates to three dimensional optical memory storage, and in particular to the use of polymer nanocomposite materials for three dimensional optical memory storage. Local two-photon-induced photobleaching of particles in an array of particles in the nanocomposite material causes each particle to perform as an individual bit.

In the present invention, local photosensitive changes are effected in particles in the nanocomposite. An example of the local photosensitive change is photobleaching, and the present invention will be particularly described herein with reference to photobleaching.

BACKGROUND OF THE INVENTION

Further advances in computer technology depend critically on the development of materials for high-density memory storage. Intensive research is focused on designing materials for three-dimensional (3D) optical memory storage, since in 3D the capacity of data storage is a function of $1/\lambda^3$ compared to $1/\lambda^2$ for two-dimensional media, where $\lambda$ is the addressing wavelength. To date, such materials are represented by transparent polymer glasses containing molecularly dispersed photochromic species. Optical recording is achieved by inducing local photochemical changes in the chromophore, which lead to two distinct molecular forms with different optical properties.

For instance, U.S. Pat. No. 5,325,324 discloses three-dimensional optical memory, in which selected domains, e.g., $10^3 \times 10^3$ domains arrayed in a plane within a three-dimensional volume of active medium, are temporally and spatially simultaneously illuminated by two radiation beams.

U.S. Pat. No. 5,694,249 discloses a three-dimensional optical memory element made of glass. The glass includes a glass matrix with a first refractive index and a plurality of spots distributed in the glass matrix that have a different refractive index. The spots are formed at the focal point of a laser.

U.S. Pat. No. 5,268,862 discloses an active medium, e.g., a photochromic material in a three-dimensional matrix, e.g., a polymer. The active medium is illuminated by two UV laser light beams in selected regions. Two-photon absorption effects a change in the photochromic material that may be made to fluoresce for reading.

U.S. Pat. No. 5,289,407 discloses alteration of the index of refraction of a photopolymer by two-photon excitation. Memories that rely on fluorescence modulation are stated to suffer the limitation that their useful life is limited by photobleaching. U.S. Pat. No. 5,034,613 discloses two-photon laser microscopy.

WO 98/53448 discloses three-dimensional optical memory with fluorescent photosensitive material.

Further improvements in three-dimensional optical memory storage are required.

SUMMARY OF THE INVENTION

A new approach to three-dimensional optical memory storage has now been found.

Accordingly, one aspect of the present invention provides a method for providing three dimensional optical memory storage, comprising:

subjecting a nanocomposite to irradiation, said nanocomposite comprising a matrix of particles of a core resin and a shell resin, said shell resin forming a continuous phase of the matrix, said particles of core resin containing at least one photosensitive compound and being in an array in said matrix, said continuous phase being substantially free of said photosensitive compound;

said irradiation being selectively focused on individual particles in said array to effect local photo-sensitive changes in said individual particles, said irradiation being two-photon irradiation of a wavelength to effect said local photo-sensitive changes.

In preferred embodiments of the invention, said local photo-sensitive change is photobleaching.

In embodiments, particles adjacent to the selected particle in the direction of irradiation are photobleached by less than 25%. Preferably, the selected particle is photobleached by more than 50%.

In further embodiments, the core resin comprises a latex of poly(methyl methacrylate), and the shell resin comprises a copolymer of methyl methacrylate and butyl methacrylate monomers.

In other preferred embodiments, the core resin is in a liquid state and is surrounded by a first shell resin to contain the liquid core and a second shell resin that forms the continuous phase of the matrix.

In other embodiments, the particles comprise a latex of an encapsulated polymer of copolymer wherein the core and shell resins are polymers selected from the group consisting of styrene-butadiene, styrene, acrylate, methacrylate, polyesters, and mixtures thereof.

In still further embodiments, the core particles are present in an amount of from about 0.1 to about 70 weight percent based on the total weight of the media, the shell resin is present in amounts of from about 30 to about 99.9 weight percent based on the total weight of the composition, and the core particles are separated from nearest neighboring core particles by the shell resin continuous phase.

BRIEF DESCRIPTION OF THE DRAWINGS

The present invention is illustrated by the embodiments shown in the drawings, in which.

DETAILED DESCRIPTION OF THE PREFERRED EMBODIMENTS

Figure 1A:
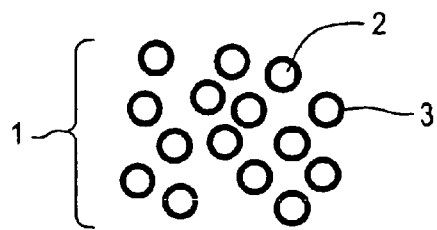
FIG. 1 is a schematic representation of the formation of a nanocomposite of Example I.

The present invention relates to three-dimensional (3D) optical memory storage. Such memory storage is achieved using nanocomposite materials, examples of which are disclosed in U.S. Pat. No. 5,952,131. The nanocomposite is a composition comprising a matrix of particles of a core resin and a shell resin, in which the core resin contains a photosensitive compound, especially a covalently bonded photosensitive compound, and the shell resin forms the continuous phase of the matrix. Such nanocomposites may be obtained in a process comprising organizing particles comprised of a core resin and a shell resin, in which the core resin contains a photosensitive compound, into a three dimensional array. The array is then heated to melt the outer shell resin of the particles, thereby fixing the particles of the array into a high density storage media. Such a process is described in U.S. Pat. No. 5,952,131.

The organizing of the particles may be accomplished by various known chemical and physical methods for reducing the bulk volume of latex suspension systems such as one or more of concentration, evaporation, precipitation, aggregation, agglomeration, partial annealing, freeze drying, electrophoresis, and similar processes. Organizing results in the formation of a close packed but loosely held, i.e., fragile, three-dimensional array of particles. Oscillatory motion may be used to facilitate ordering of the array of particles, as is disclosed in U.S. patent application Ser. No. 60/137,500 of E. Kumacheva et al., filed Nov. 30, 1999. The array is heated to stabilize the array of particles, at which time the shell polymer forms a matrix of polymer in which the particles are held. Heating may be carried out over a wide range of temperatures and times, e.g., from about 50° to about 200° C., and preferably from about 55° to about 100° C., and for from about 30 minutes to about 12 hours, and preferably from about 30 minutes to about 2 hours. The heating conditions depend upon for example, the size of the sample, the glass transition temperature of the shell resin, the heat transfer properties and the type and level of entrapped solvent(s).

As disclosed in U.S. Pat. No. 5,952,131, exemplary core-shell resin particles may have an average diameter from about 100 to about 3,000 nanometers, preferably from about 200 to about 2,000 nanometers, and a polydispersity or a geometric size distribution, of about 1.00 to about 1.10.

Monodisperse core shell lattices or dispersions can be prepared in accordance with, for example, *J. Appl. Pol. Sci.*, 1995, 58, 2047, and *J. Pol. Sci., Part A: Pol. Chem.*, 1995, 33, 1597, the disclosures of which are incorporated herein by reference in their entirety. Such methods provide particles which possess high dispersion stability, narrow particle size distributions, and are free of secondary particles or seed generations.

In the solid core embodiment of the present invention, the core resins may be any resin or mixture of resins that have a glass transition temperature that is greater than the glass transition temperature of the shell resin. The core resins should be comprised of polymer that may conveniently be prepared and which has incorporated therein a photosensitive compound in the polymer main chain or, alternatively, chemically appended to the main chain or to a functional group attached to the main chain. As a further alternative, the photosensitive compound may be mixed or blended with the core resin. Examples of polymers for the core and shell resins are poly(styrene-butadiene), polystyrene, polyacrylate, polymethacrylate, poly(methyl methacrylate) and polyesters, and mixtures thereof. Other polymers may be used. A preferred core resin is a homopolymer of poly (methyl methacrylate) prepared by emulsion polymerization of methyl methacrylate monomer, as illustrated herein. It is understood that the polymers must be sufficiently transparent to permit photobleaching of the photosensitive compound as described herein, and for subsequent reading of the pattern of photobleached particles.

While the present invention includes this solid core embodiment, in a preferred embodiment of the invention, the core resin is in a liquid state, especially a liquid retained within the shell resin, as described more extensively below.

In the solid core embodiment of the present invention, the shell resin can be any resin, or mixture of resins, which have a glass transition temperature less than the glass transition temperature of the core resin. For example, the shell resin composition can be selected such that the glass transition temperature (Tg) of the shell resin is from about 20° to about 80° C. lower than the glass transition temperature of the core resin. One example is a copolymer obtained from polymerization of methyl methacrylate and butyl methacrylate monomers.

The weight average molecular weight ($M_W$) of the core and shell resins may be varied over a wide range, for example, from about 15,000 to about 300,000, and preferably from about 15,000 to about 100,000. The weight ratio of the core resin to the shell resin may be, for example, from about 1:1,000 to about 2.3:1, and preferably from about 1:100 to about 1.5:1.

In a preferred embodiment, the core resin is crosslinked and the photosensitive compound is bound, or permanently attached, to the core resin to prevent substantial physical movement or migration of the photosensitive compound between the core and the shell matrix. Crosslinking the core polymer further enhances the structural and photoresponsive integrity of the three dimensional array. The cross-linking agent can be present in the core resin in an amount of, for example, from about 0.1 to about 2 molar percent, and preferably from about 0.5 to about 2.0 molar percent based on the total weight of the core resin. The photosensitive compound can be present in the core in an amount of from about 0.015 to about 0.5 molar percent, and preferably from about 0.05 to about 0.20 molar percent based on the total weight of the core resin.

In the particular embodiment of use of 4-amino-7-nitrobenzo-2-oxa-1,3-diazol as the photosensitive compound, the amount of compound present in the core is from about 0.045 to about 1.5 percent by weight, and preferably 0.15 to about 0.60 percent by weight, based on the total weight of the core.

The photosensitive compound may be, for example, photochromic, fluorescent, phosphorescent, and mixtures thereof, or similar compounds. One example of a suitable photosensitive compound is a 4-amino-7-nitrobenzo-2-oxa-1,3-diazol compound which compound is photobleached upon irradiation at higher writing irradiation intensities, as disclosed herein.

As disclosed in U.S. Pat. No. 5,952,131, the core particles may be present in the storage media in amounts of from about 0.1 to about 70 weight percent based on the total weight of the media, and the shell resin may be present in amounts of from about 30 to about 99.9 weight percent based on the total weight of the media. The encapsulated resin particles of the compacted latex are preferably closely packed and may be present in concentrations, for example, of from about $10^{11}$ to about $10^{16}$ particles per cubic centimeter. In the matrix storage media, the concentration of particles may increase substantially as a result of the heating step to form the matrix.

In the matrix, each of the resin encapsulated core particles are in a closely packed relationship with adjacent resin encapsulated core particles. The adjacent particles are fixed within the matrix by attachment to adjacent or nearest neighboring particles through shell resin bridging or resin sharing between particles. Preferably, there are substantially no direct contacts between adjacent core particles.

The matrix of core particles has been particularly described herein with reference to use of one photosensitive compound. It is to be understood that more than one photosensitive compound could be used, especially if the compounds have separate and distinct absorption spectra, so that photobleached particles may be read with light of different wavelengths. Nanocomposites containing more than one photosensitive compound are disclosed in U.S. Provisional Patent Application No. 60/168,386 of E. Kumacheva filed Dec. 2, 1999.

The dimensions of cores and shells generally determine the average distance between the planes of particles in the z-direction, that is, the distance between the planes of optical recording. For example, when the core and the shell diameter were about 640 and 1040 nanometers, respectively, the interplane separation was about 0.9 micron, and when the core and the shell diameter were about 360 and 530 nanometers, respectively, the separation was 0.5 microns.

Two-photon confocal microscopes are known, for example as described in U.S. Pat. No. 5,034,613 of W. Denk et al. That patent describes two-photon excitation of fluorophores by highly intense, short pulses of light, and provides general fluorescence techniques for microscopy with improved background discrimination, reduced photobleaching of the fluorophores, and minimized photo damage to living cell specimens. Two-photon irradiation is made possible by the combination of the very high, local, instantaneous intensity provided by the tight focusing available in a confocal laser microscope, wherein the laser can be focused to diffraction-limited waist of less than 1 micron in diameter, and use of a pulsed laser. A high intensity, long wavelength, monochromatic light source which is focusable to the diffraction limit such as a colliding-pulse, mode-locked dye laser, produces a stream of pulses, with each pulse having a duration of about 100 femtoseconds (100× $10^{-15}$ seconds) at a repetition rate of about 80 MHz. These subpicosecond pulses are supplied to the microscope, for example by way of a dichroic mirror, and are directed through the microscope optics to a specimen, or target material, located at the object plane of the microscope. Only in the region of the focal point on the object plane at the waist formed by the converging and diverging cones is the intensity sufficiently high to produce two photon absorption in the specimen. This absorption is produced by means of a stream of fast, high intensity, femtosecond pulses of relatively long wavelength, which retains a moderate average illumination intensity of long wavelength light throughout the remainder of the specimen outside the region of the focal point. Although two-photon writing is illustrated herein using femtosecond pulses, other pulses with a peak power of greater than 1KW may be used.

Figure 6:
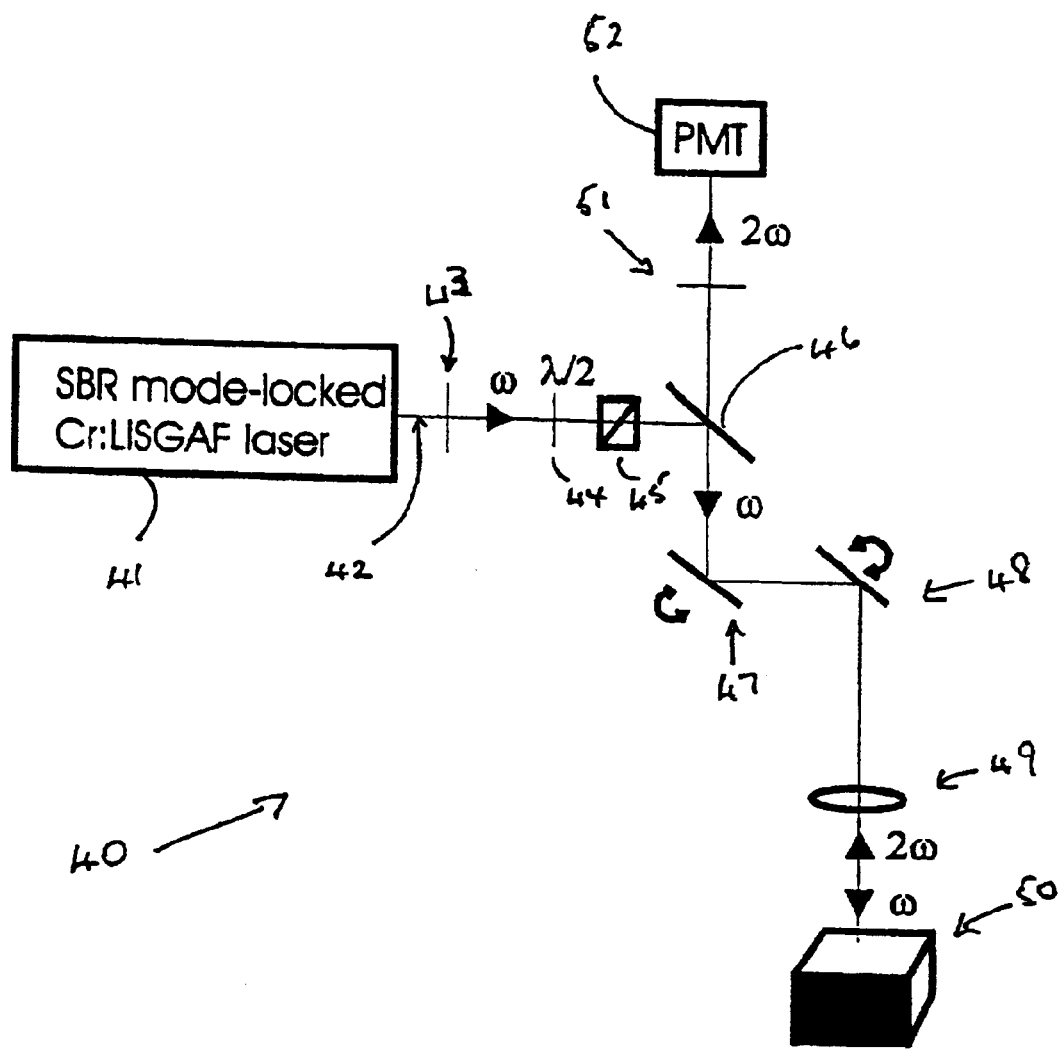
FIG. 6 is a schematic representation of a two-photon confocal microscope.

Another example of a two-photon confocal microscope is shown in FIG. 6. The two-photon confocal microscope is generally indicated by 40. Confocal microscope 40 has SBR mode-locked Cr:LiSGaG laser 41 which emits light 42 through shutter 43. Light 42 passes through a half wave phase retardation sheet i.e., a λ/2 sheet, 44 and then prism 45 to dichroic mirror 46. Light from dichroic mirror 46 is reflected to scanning mirrors 47 and 48. Scanning mirrors 47 and 48 are movable, to control the position of the beam of light on the sample. Light 42 then passes through objective lens 49 and is focused on sample 50. Objective lens 49 may be, for example, a 100× lens with a numerical aperture of 1.3.

In a read-only mode, light from the sample is reflected back through objective lens 49 to scanning mirrors 48 and 47. The light then passes through dichroic mirror 46, as the reflected light has a wavelength twice that of the incident light, and the dichroic mirror is selected to pass light of that wavelength. The light then passes through IR filter 51 to photomultiplier tube (PMT) 52.

In use for recording, the photosensitive compound is selected to have an absorption peak at a wavelength approximately half that of the light of the laser. For instance, 4-amino-7-nitrobenzo-2-oxa-1,3-diazol-methacrylate has an absorption peak at 470 nm The Cr:LiSGaF laser illustrated in FIG. 6 has an output of light having a wavelength of 844 nm.

A nanocomposite material is used as the sample. Light from the laser is selectively focused on a particle in the nanocomposite. The particle contains the photosensitive compound, which is locally photobleached by the light. The photobleaching is intended to be permanent, and not an excited transition state, thereby rendering the nanocomposite readable, especially with one-photon light which does not have the energy to effect photobleaching. Information is stored, and readable, by the pattern of photobleaching of the particles. Such photobleaching is intended to be of particles in the three dimensional array in the nanocomposite.

Advantages of the present invention include providing for sample manufacturing processes for three-dimensional optical recording media by employing previously prepared and well defined engineered subunit particles. The structure of the optically sensitive three-dimensional material can be characterized by, for example, Laser Confocal Fluorescent Microscopy (LCFM).

The three-dimensional composition and imaging processes of the present invention are highly suitable in, for example, optical recording. In an example imaging application, irradiation of the annealed nanocomposite material with a laser beam focused in a specific plane induced photobleaching of the photosensitive compound contained in the core polymer particles, which resulted in the appearance of black marks. Reading of the recorded information can be accomplished by irradiation of the material with the same or similar laser beam with the exception that the incident laser intensity is preferably reduced to increase the useful readable lifetime of the material.

In a preferred embodiment, the fluorescent particles could have a more complicated structure, e.g. contain a central liquid core synthesized from a polymer with a low glass transition temperature, a second layer synthesized from a rigid polymer, and a third layer that will perform as a shell transforming into a matrix at the stage of annealing. In this embodiment, the photochemical reactions will occur in liquid "containers," thus increasing the speed of writing in 3D.

The liquid core embodiment of the present invention may be synthesized as follows. In the first step, three-layer composite latex particles are synthesized, in which the CFP (core forming polymer) is a low glass transition temperature (low-$T_g$) polymer. The core is coated with two shells synthesized from high glass transition temperature (high-$T_g$) polymers, shell forming polymer 1 (SFP1) and shell forming polymer 2 (SFP2), respectively. SFP1 is the layer first coating the core. The relationship between the glass transition temperatures of the CFP, SFP1 and SFP2 is $T_{g, CFP} < T_{room}$; $T_{g, SFP1} > T_{g, SFP2} > T_{g, CFP}$; $T_{g, SFP2} > T_{room}$.

The glass transition temperature for the core is preferably from about −50 to about 15° C. The glass transition temperature for SFP1 is preferably from about 100 to about 150° C. The glass transition temperature for SFP2 is preferably from about 60 to about 90° C.

After synthesis, the composite particles are assembled in 1-, 2- or 3-dimensional arrays using any suitable technique, e.g., sedimentation, filtration, or capillary flow or electrodeposition, and then dried. The particle array is then subsequently heat processed at an annealing temperature ($T_{ann}$) such that $T_{g,\ SFP1} < T_{ann} < T_{g,\ SFP2}$. Under these conditions, a continuous phase matrix is formed from the SFP2 while retaining the liquid core structure of the composite particles.

In the synthesis of liquid core particles with a core-shell structure, it is beneficial to have a good compatibility (or low interfacial tension) between the core- and shell-forming polymers. Depending on the interfacial tension between the CFP and a SFP and their volume ratio, composite latex microbeads may exhibit either complete phase-separation or peculiar raspberry, mushroom or "acorn" morphologies (high interfacial tension), or uniform coating of the cores with the SFP (low interfacial tension). The compatibility between CFPs and SFPs is generally achieved by modifying their compositions, by using compatibilizers well known in the art, or by employing grafted macromonomers in synthesis of the SFP. The compositions of the CFPs and SFPs may be modified to have more similar monomers, e.g., a small fraction of the shell-forming monomer may be introduced into the core. Preferred compatibilizers include block copolymers. For the poly(methyl methacrylate) core and poly(butyl acrylate) shell, the compatibilizer may be poly (methyl methacrylate)—poly(butyl acrylate) block copolymer.

In the preparation of core-shell latex particles, it is also beneficial to limit mutual diffusion on the core- and shell-forming polymers. Mutual diffusion may counteract the formation of a distinct core-shell structure. Mutual diffusion can be suppressed by cross-linking of the CFP and/or the SFP. Of course, in the synthesis of fluid core particles, in order to keep $T_{g,\ CFP}$ below the ambient temperature, the degree of crosslinking should be low. Also, in the synthesis of core-shell particles with fluid cores and especially during film formation, it is beneficial to limit collapse. Reduction in the cross-linking density of the SFP may suppress collapse of the liquid cores.

It is also beneficial for the core-shell particles to have the minimum possible thickness of SFP1, i.e., with the maximum ratio between the diameter of the fluid cores and the thickness of the inert rigid shell.

SFP1 may have an average thickness of about 50 to about 100 nm. An especially preferred SFP1 may have an average thickness of about 55 nm.

The liquid core may have an average diameter of about 300 to about 1000 nm. An especially preferred liquid core may have an average diameter of about 550 nm.

Preferably, both the CFP and SFP1 are polymers formed from monomers having at least two of the same monomers in common. More preferably, a same group of monomers is used to prepare both the CFP and SFP1. Most preferably, both the CFP and the SFP1 comprise copolymers of poly (butyl acrylate) (PBA) and poly(methyl methacrylate) (PMMA), with a different weight ratio PBA/PMMA in the CFP and the SFP1 to achieve the necessary difference in glass transition temperature.

The weight ratio of PBA/PMMA in SFP1 may be denoted by $\phi$. $\phi$ may vary from, for example, above about 0.0 to, for example, about 0.25. The weight ratio of SFP1/CFP may be denoted by $\Phi$. $\Phi$ may vary from, for example, above about 0.0 to about 2.0. $\phi$ and $\Phi$ provide a comparison of the characteristics of various core/shell embodiments.

It has been found that an optimum ratio PBA/PMMA in the SFP1 ($\phi$) exists, which provides the formation of the thin shell uniformly covering the fluid core in early stages of the shell synthesis. A range of from about 5:95 to about 10:90 of PBA/PMMA is especially preferred. The phenomenon of collapse of the rigid shells is suppressed by increasing the degree of crosslinking of the SFP1.

In a preferred embodiment, the ratio of poly(butyl acrylate) to poly(methyl methacrylate) in the liquid core resin is from about 40 to about 70, mole percentage basis, and the ratio of poly(butyl acrylate) to poly(methyl methacrylate) in the inner shell resin is from about 5 to about 10, mole percentage basis.

Since both the CFP and the SFP in the composite latex particles may be crosslinked, the polymer diffusion of the polymers between latex cores and shells is substantially suppressed. Under these conditions, partial spreading of the fluid CFP on solid surfaces, which is observed at early stages of shell synthesis, can be explained by two reasons.

In a first case, when the SFP1 consists of a pure PMMA ($\phi$=0), because of the substantial difference in interfacial tension between the CFP and the SFP1, encapsulation of the fluid cores occurs presumably through the nucleation of the PMMA particles adhering to the PBA/PMMA core. For ($\Phi$=1.33, the surface of the latex cores is covered by scarce PMMA clusters with the height and diameter of about 26 nm and 30 nm, respectively. Such coating obviously cannot suppress partial spreading of the fluid on the solid surface. In a second case, for $\phi$=0.2, interfacial tension between the CFP and the SFP is at minimum. It can be anticipated that the latex cores are coated with a thin layer of the SFP1 or, at least, the degree of coverage is increased in comparison with that obtained for $\phi$=0.05 and $\phi$=0.1. The fact that the shell does not protect liquid particles from spreading, can be explained by the enrichment of the SFP with PBA. Between the two limits, for $\phi$=0.05 and 0.1, the compatibility between the CFP and the SFP is sufficient to coat the liquid cores with a dense layer of the SFP and the composition of the SFP1 is sufficient to support the spherical shape of particles.

Following an increase in $\Phi$, the degree of surface coverage of fluid cores with the SFP increases. For example, for $\Phi$=1.67 and $\phi$=0, the clusters of PMMA first merge to form a shell of the SFP1. This shell is sufficient to support a spherical shape of the core-shell particles, but is not complete enough to suppress partial leakage of the CFP. For $\phi$=0.05 and 0.1, the SFP1 densely covers the fluid cores at a significantly earlier stage of the SFP1 synthesis. For $\Phi$=1.67, when $\phi$=0.05 or $\phi$=0.1, the thickness and the density of the shells is sufficient to preserve the spherical shape of the core-shell particles.

Table 2 summarizes the effect of the interrelationship between $\Phi$ and $\phi$ in the synthesis of the core-shell particles with fluid cores. The earliest encapsulation of the fluid cores, characterized by the well-defined spherical shape of the core-shell particles and the absence of stickiness, occurs for $\phi$=0.05 and $\phi$=0.1, whereas for $\phi$=0 and for $\phi$=0.25 encapsulation occurs only in late stages of the SFP1 synthesis for $\Phi$=2.0. Thus, for $\phi$=0.05 and for $\phi$=0.1, the thinnest rigid shells can be obtained in the composite particles, whose thickness calculated from the corresponding of $\Phi$ is ca. 0.9 of that obtained for $\phi$=0.1 and for $\phi$=0.2. In Table 2: S signifies the spreading of the fluid cores on the solid substrate; L signifies core-shell particles maintain a spherical shape but leakage of CFP occurs through the shell; and P signifies that core-shell particles have sharp non-sticky boundaries.

| | | φ | | | |
|---|---|---|---|---|---|
| | | 0 | 0.05 | 0.1 | 0.25 |
| Φ | 1.33 | S | L | L | S |
| | 1.67 | L | P | P | L |
| | 2.0 | P | P | P | P |

When φ=0.2, particle protection from spreading for lower values of Φ is presumably associated with the change in composition of the SFP1 in later stages of the shell synthesis.

The earliest encapsulation of the fluid cores characterized by the well-defined shape of the core-shell particles and the absence of stickiness occurs for $\phi=0.05$ and $\phi=0.1$, whereas in later stages of the SFP1 synthesis, uniform latex shells can be produced for $\phi=0$ and $\phi=0.2$. Thus, for $\phi=0.05$, the thinnest rigid shells can be obtained in the composite particles.

Two types of defects observed in the core-shell particles may be induced by two different mechanisms. The presence of slits on the surface of the average size particles can be explained by an incomplete coverage of the liquid cores with the SFP1. When $\Phi$ reaches 2.0, the slits become smaller and for large values of $\Phi$, can be ultimately "healed."

The second type of defect originates from cracking and collapse of the core-shell particles. This phenomenon has been observed when liquid particles, not necessarily of a polymeric nature, are encapsulated with rigid polymeric shells. Several reasons may be suggested for the collapse of latex shells, including interfacial tension gradients during synthesis, capillary forces acting between particles when the latex is dried under ambient conditions, and action of high vacuum in SEM experiments. In addition, pressure gradients could appear in the rigid latex shell when the dispersions are cooled from the reaction temperature down to the room temperature. It should be stressed that collapse of the rigid shells may be dominated by different factors in different stages of the preparation of core-shell microspheres.

The cooling of the latexes after synthesis, the action of capillary forces during latex drying, and the evacuation of air in the preparation of samples for SEM have the same effect on the core-shell particles: they generate pressure gradients in the latex shells, which may be sufficient to break the SFP1. The CFP and the SFP1 obviously have different thermal and mechanical properties. Upon latex cooling from about 90° C. to about 23° C., the different degree of shrinking of the CFP and SFP1 generates pressure gradients in the latex shell. The factors favoring the stresses in the shell include (i) the difference in linear and volume thermoexpansion coefficients of the CFP and SFP; (ii) the chemical grafting of the SFP1 to the surface of the CFP and (iii) the rigidity of the SFP1.

Let $r_c$, $l_s$ and R be the radius of the liquid core, the thickness of the rigid shells and the radius of the core-shell particle, respectively; $l_s=R-r_c$. When the latex core and shell shrink, a gradient in pressure, grad p, arises in the latex shell.

$$\text{grad } p=|P_{in}-P_{out}|/l_s$$

where $P_{in}$ and $P_{out}$ are the pressures imposed on the inner and the outer surfaces of the shell. $P_{in}$ is equal to the pressure on the surface of the core, while $P_{out}$ is the pressure on the surface of the core-shell particle.

When $F_{in}$ and $F_{out}$ are the radial forces acting perpendicular to the inner and outer surfaces of the latex shell, and $S_{in}$ and $S_{out}$ are the surface areas of the latex cores and the core-shell particles, respectively. $S_{in}=4\pi r_c^2$ and $S_{out}=4\pi R^2$. Then, $$P_{in}=F_{in}/S_{in} \text{ and } P_{out}=F_{out}/S_{out}$$

and $$\text{grad } p=|F_{in}/4\pi r_c^2-F_{out}/4\pi R^2|/l_s$$

It should be noted that pressure gradient is a vector whose direction is determined by the relationship between the mechanical properties of the CFP and the SFP1. If $F_{in}>F_{out}$, the pressure vector is pointing out, and the latex shell may tend to craze and "explode," whereas for $F_{in}<F_{out}$, the pressure vector is directed to the center of the particle and the shell may tend to shrink and crack.

Assuming elastic response of the CFP and the SFP1 to deformation, the value of $F_{in}$ and $F_{out}$ can be found as $F_{in}=E_{CFP}\,\Delta r_c/r_c$ and $F_{out}=E_{SFP1}\Delta l_s l_s$, where $E_{CFP}$ and $E_{SFP1}$ are the Young's moduli of the CFP and SFP1, and $\Delta r_c/r_c$ and $\Delta l_s/l_s$ are the strains of the CFP and the SFP1, respectively. Rewriting grad p, $$\text{grad } p=|[E_{CFP}\alpha_{CFP}r_c\Delta T/4\pi r_c^3-E_{SFP}\alpha_{SFP}l_s\Delta T/4l_s\pi R^2]|/l_s$$

and after rearranging $$\text{grad } p=\Delta T/4\pi l_s|[E_{CFP}\alpha_{CFP}/r_c^2-E_{SFP}\alpha_{SFP}/R^2]|$$

The pressure gradient in the SFP increases with the difference $T_{reaction}-T_{ambient}$ and with the thinning of the latex shell. Thus the reduction in the shell thickness in composite latex particles has to be approached very cautiously. Further, it can be derived that grad p is at minimum when $$(R/r_c)^2\approx(E_{SFP}\alpha_{SFP})/(E_{CFP}\alpha_{CFP})$$

or, for the core-shell particles synthesized in the current work, with $r_c=210$ nm and R=275 nm, $(E_{SFP}\alpha_{SFP})/(E_{CFP}\alpha_{CFP})\approx1.7$.

Realistically, the exact relation between the values of the Young's moduli and the thermoexpansion coefficients of the CFP and the SFP1, leading to the minimization of grad p in the latex shells, is unlikely. In this situation, collapse of the shells will depend on the fracture strength of the SFP1, which increases with the degree of crosslinking. Suppressed cracking of the latex shells observed for the increased degree of crosslinking results from the increased $E_{SFP}$.

In a most preferred embodiment, it has been found that the extent of crosslinking in SFP1 that is achieved in the presence of 9 mol % of EGDMA (ethylene glycol dimethacrylate) provides a sufficient fracture strength to the SFP1.

The size (diameter) of the core may vary from about 50 nm to about 1 micron. For memory storage applications, the core diameter should be about 300 to about 600 nm, the thickness of SFP1 should be about 20 to about 60 nm, and the thickness of SFP2 should be about 100 to about 300 nm. It is preferred that SFP1 be as small as possible without resulting in collapse.

It should be noted that for rubber-like latex shells covering fluid cores, crosslinking can have the opposite effect since stress relaxation in the latex shells will be determined by the elasticity of shell-forming polymer.

Finally, it has to be stressed that in the modified "core-shell" approach, careful tuning of the composition of the SFP2 can also lead to the formation of the nanocomposite matrix without leakage of the CFP. According to the equation $(R/r_c)^2 \approx (E_{SFP}\alpha_{SFP})/(E_{CFP}\alpha_{CFP})$, for a particular ratio $R/r_c$, a particular ratio of the product of the Young modulus and the thermoexpansion coefficient of the SFP to the product of the Young modulus and the thermoexpansion coefficient of the CFP, may be determined by changing the compositions of the polymers.

The rate of writing may also be increased by incorporating more efficient 2-photon dyes, now becoming available, into the core particles. In addition, employment of a shorter wavelength (of ca. 600–700 nm) will lead to the reduction of the size of the individual fluorescent particle that can be addressed, and will provide a storage density of about $10^{13}$ bits/cm$^3$.

The present invention is particularly described herein with reference to the irradiation being a single beam selectively focused on the particles. This is a preferred embodiment. However, the two-photon irradiation may be obtained using two beams of irradiation that intersect at the selected particle.

There are several advantages of the nanocomposite material containing a chromophore localized in periodic microscopic domains versus materials containing chromophores molecularly dispersed in a polymeric medium. First, in the material with a discrete structure an optically transparent matrix is not affected by irradiation, providing a significantly higher signal-to-noise ratio than in a homogeneous material. Thus, when the light spot of ca. 0.5 µm in diameter is focused on a particular particle, the lateral dimensions of the bit are determined by the size of this particle. To achieve the same signal-to-noise ratio in the materials with the molecularly dispersed chromophores, the lateral distance between the "written" spots should be on the order of several µm, which is about 2–3 times greater than that in the nanocomposite. In z-direction, the minimum separation between the addressed planes is 2.5 µm in a nanocomposite versus 5 µm in a homogeneous material. Thus, in the traditional homogeneous materials, the size of the bit tends to be twice as big as in the nanocomposite material and consequently the density of bits in 3D is at least eight times lower, which leads to at least 25 times higher memory capacity in the nanocomposite material.

The present invention demonstrates a new concept in producing materials for 3D optical memory storage.

The present invention is illustrated by the following examples. Parts and percentages are by weight unless otherwise indicated.

EXAMPLE I

Figure 1B:
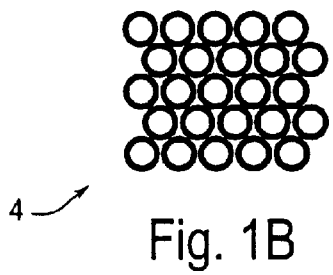
Figure 1C:
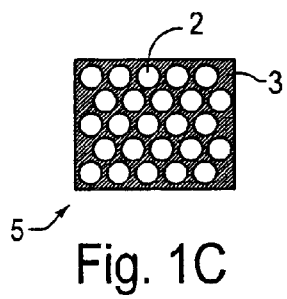

A nanocomposite material with a periodic structure was prepared using monodisperse latex particles composed of rigid cores and softer shells, as illustrated in FIG. 1, part A. The core-shell particles 1 had poly(methyl methacrylate) (PMMA) cores 2 and poly(methyl methacrylate)-poly(butyl methacrylate) shells 3 synthesized using a multistage emulsion polymerization, as described in U.S. Pat. No. 5,952,131.

A fluorescent comonomer 4-amino-7-nitrobenzo-2-oxa-1,3-diazol-methacrylate (NBD-MA) was synthesized and copolymerized with PMMA in amount of ca. 0.02 mol %. The absorption peak of the NBD was 470 nm. The diffusion of the dye-labeled PMMA molecules from the cores to the shells was suppressed by cross-linking the core-forming polymer. The dimensions of the fluorescent cores ranged from 100 to 800 nm. Latex particles with 500 nm cores and 200 nm thick shells were used. A periodic array of the microbeads 4 (FIG. 1, part B) was formed by slow settling from dilute dispersions (c≈2 wt. %). Under these conditions, the minimum energy configuration corresponds to assembly of the latex particles in either HCP or FCC crystal structure. The samples, with the thickness ranging from 1 to 10 mm showed efficient Bragg's diffraction in the reflection mode.

A nanocomposite film 5 (FIG. 1, part C) was formed by annealing particle sediments at a temperature that was above the glass transition temperature of the shell-forming polymer (SFP) and below the glass transition temperature of the core-forming polymer (CFP).

Figure 2:
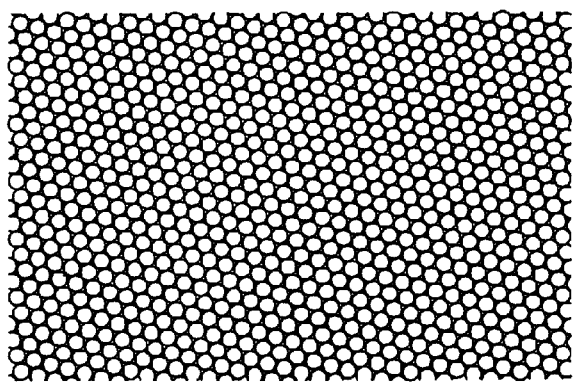
FIG. 2 is a schematic representation of the structure of the nanocomposite film.

The structure of the films was studied with a one-photon laser confocal fluorescent microscopy (LCFM) using chromophore excitation with the 488 nm line of an argon ion laser. The typical structure of the material is shown in FIG. 2. Periodic lateral monodomains exceeded the field of view of 80 µm×80 µm, whereas in the vertical (z) direction periodic structure persisted up to the depth of ca. 400 µm accessible in LCFM. The number density of the photosensitive beads in the nanocomposite material was 2.6×10$^{12}$/cm$^3$.

EXAMPLE II

Each fluorescent particle of a nanocomposite material was addressed individually, thus making it perform as an individual bit. Optical recording in the polymer nanocomposite was achieved using localized two-photon-induced photobleaching of the fluorescent dye located in the core particles. A selected fluorescent particle in the bulk nanocomposite was addressed using a confocal fluorescent microscope equipped for two-photon imaging.

A 150 MHz-repetition-rate, diode-pumped Cr:LiSGaF femtosecond pulse laser developed at the University of Toronto, which produced an excitation wavelength of 844 nm, was used. Since the absorption peak of the dye is 470 nm, and the polymer is optically transparent in the visible and near IR range, the only coupling of the laser light to the chromophore is be expected through the two-photon absorption.

Assuming a Gaussian beam profile, the size of the diffraction-limited spot of light was determined as $\Delta x = 0.61 \lambda [(n)^{1/2} NA]$ where NA is the numerical aperture of the objective. For NA=1.3, λ=844 nm, and n=2, a lateral resolution of ca. 0.3 µm was estimated. Thus by focusing a laser beam on a particular fluorescent bead, local photobleaching of this particle could be achieved. The changes in fluorescent intensity induced in the material were read out using LCFM at a lower intensity of irradiation.

Figure 3:
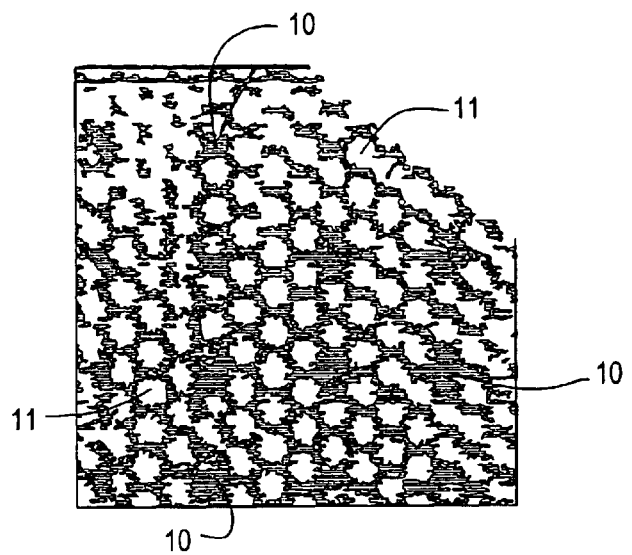
FIG. 3 is a schematic representation of a two-dimensional plane of a nanocomposite film after selective photobleaching in Example II.

FIG. 3 demonstrates a two-dimensional plane of the nanocomposite material located at the distance of ca. 200 µm from the top surface, in which recording was carried out. Locally photobleached fluorescent core particles 10 appear as missing black spots in the array of non-photobleached fluorescent core particles 11. Good contrast between the initial and the "recorded" states corresponding to a 50% decrease in fluorescent intensity was achieved at the exposure time of ca. 20 ms. The speed of the photobleaching of NBD was determined by the effective two-photon cross-section of the chromophore, which at 844 nm was on the order of $10^{-54}$ cm$^4$s/photon, and partial mismatch between the absorption peak of the NBD and the photobleaching wavelength (470 nm versus 422 nm, respectively).

The mechanism of photobleaching of NBD is most likely oxidation of the chromophore. The photo-chemical change of the dye was irreversible and stable providing the basis for permanent data storage. The recorded bits could be repetitively re-imaged in the read out process and endured after a time period exceeding one year.

Figure 4:
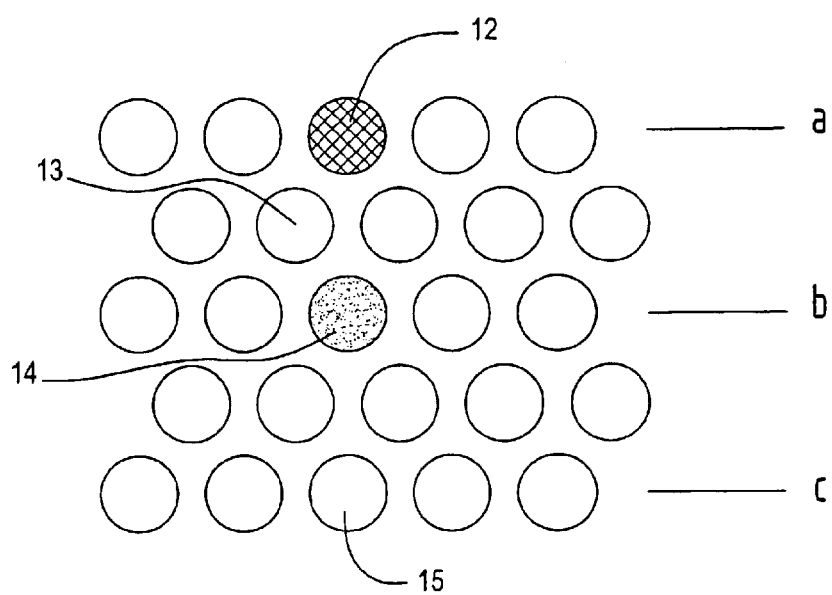
FIG. 4 is a laser confocal fluorescent microscopy image of a vertical cross-section of a nanocomposite after selective photobleaching.

The advantage of the two-photon versus one-photon recording in the 3D nanocomposite material arises from the enhanced depth discrimination of the latter process. For the comparable irradiation in one-photon-induced photobleaching, up to ±10 μm from the addressed plane was affected in z-direction due to the linear absorption of light, i.e. for a 0.5 μm spot of light about 10 individual fluorescent particles were affected in z-direction. In the two-photon process, due to quadratic scaling with intensity, absorption is limited to the focal region of the addressing beam. The results characterizing depth discrimination of the two-photon writing are demonstrated in FIG. 4. The difference between the intact fluorescent particles and the non-fluorescent background gives a reference signal-to-noise ratio of ca. 35%. The "written" state of the addressed particle 12 located in the focal plane is represented by the change in its fluorescence intensity (FIG. 4, line profile a). The relative change in fluorescent intensity of the photobleached particle is about 50%, exceeding the reference signal-to-noise ratio.

In the layer adjacent to the focal plane and separated from it by 0.65 μm. the closest fluorescent bead 13 is offset with respect to the addressed particle 12 (assuming the HCP lattice structure) and misaligned with respect to the laser beam. In the third layer from the focal plane, the fluorescent bead 14 located below the addressed particle is partially photobleached and shows about 14% reduction in fluorescence intensity (line profile b, FIG. 4). A fluorescent bead 15 located below the addressed particle in the fifth layer from the focal plane was not affected (FIG. 4, line profile c). The results shown in FIG. 4 indicate that the depth resolution for the two-photon writing is about 2.5 μm, i.e., about 6 times better than in the one-photon process.

Figure 5:
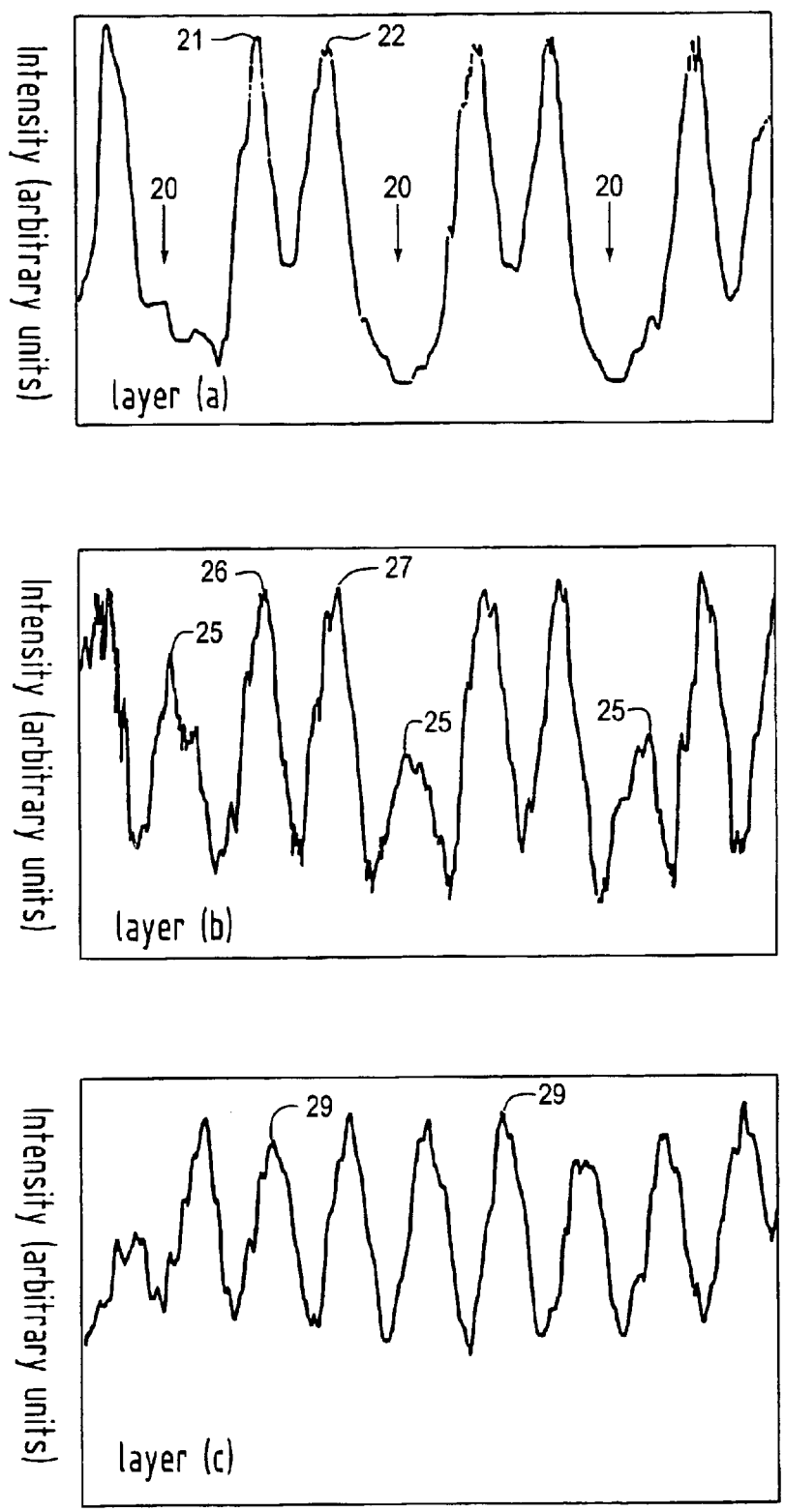
FIG. 5 is a fluorescent absorption spectra of a vertical cross-section of a nanocomposite after photobleaching.

The results shown in FIG. 4 are further illustrated in FIG. 5. FIG. 5 shows intensity, in arbitrary units, as the photobleached nanocomposite is scanned in a reading mode. The graph identified as layer (a) (see FIG. 4) shows the absorption at the layer of the focal plane, with the photobleached particle 20 showing low intensity compared with the non-photobleached particles 21 and 22.

The graph of layer (b) shows some reduction in absorption by photobleached particle 25 in comparison with non-photobleached particles 26 and 27.

The graph of layer (c) shows that all of particles 29 have essentially the same absorption spectra.

EXAMPLE III

The following example demonstrates a liquid-core embodiment of the present invention.

Methyl methacrylate (MMA, 99%) and butyl acrylate (BA, 99%) monomers (Aldrich Canada) are purified by distillation under reduced pressure. Ethylene glycol dimethacrylate (EGDMA, Aldrich, 98%) is used as supplied. The water is purified by distillation and deionized using Millipore Milli-Q Plus purification system. An ionic initiator, potassium persulfate $K_2S_2O_8$ (Aldrich, 99%), a nonionic initiator 2,2'-azobis(2-methyl-propionitrile) (AIBN, Kodak, 99%), and a chain-transfer agent 3-mercaptopropionic acid 2-ethylhexyl ester (IOMP, TCI America, 98%) are used.

A fluorescent dye-labeled comonomer 4-amino-7-nitrobenzo-2-oxa-1,3-diazole-MA (NBD-MA) used for copolymerizing with the core forming polymer (CFP) is synthesized.

After synthesis, the latexes are cooled down to the ambient temperature of about 23±2° C.

Particle size distribution in different latex dispersions at different stages of synthesis is determined using a photocorrelation spectroscopy (PCS) technique (Zetasizer-3000HS, Malvern Instruments, UK).

A Hitachi S-570 scanning electron microscope is used to characterize the morphology of the core-shell particles. A droplet of a dilute latex dispersion is dried on the aluminum SEM stub under pressure. The accelerating voltage is 15 kV, and the working distance used is 15 mm.

The glass transition temperatures of the CFP and the SFP1 in both homogeneous and core-shell particles are examined on a Perkin-Elmer DSC-7 differential scanning calorimeter under nitrogen atmosphere at a heating rate of 10° C./min.

The core-shell latex particles are synthesized via two-stage polymerization using a semicontinuous reaction scheme. A mixed ionic-nonionic initiator approach is used. Both the liquid cores and the rigid shells are synthesized from a copolymer of PBA and PMMA with a different PBA/PMMA ratio in the CFP and the SFP1. In the first stage, polymerization is initiated by an ionic initiator potassium persulfate, whereas a nonionic initiator AIBN is used in the second stage providing growth of the latex microbeads and minimizing the probability of nucleation and growth of the secondary particles.

All reactions are carried out in a three-neck flask at 80±0.1° C. The flask is equipped with a condenser, mechanical stirrer, and inlets for nitrogen and monomer. Prior to polymerization, the reaction mixture is purged with nitrogen, and a small positive pressure of nitrogen was maintained during the synthesis.

The PMMA-PBA liquid core particles are synthesized in stage 1 and their composition is maintained constant. 35 ml of water and 0.1 g of potassium persulfate are precharged into the reaction vessel and heated to the reaction temperature of 80° C. A monomer mixture containing 6 g of MMA, 9 g of BA, 0.067 g of IOMP, 0.45 g of EGDMA, and 0.008 g of the fluorescent comonomer NBD-MA is fed to the reactor via a fluid metering pump for about 3–4 hours. After completing the addition of the monomer mixture, the flask contents are stirred for 1 hour to complete the reaction.

Hard non-fluorescent PMMA-PBA shells are polymerized on the surface of the soft latex particles in stage 2. About 10 g of the latex dispersion from stage 1 and 35 ml water are mixed in the reaction vessel to provide the solid content of the mixture of about 6.7 wt. %. Then, 6 g of a monomer mixture containing MMA, BA, EGDMA, IOMP, and of AIBN are pumped into the reaction flask under stirring at the rate of about 0.01–0.05 ml/min.

In a first series of experiments, the concentration of the crosslinking agent EGDMA is varied from 0 to 1.5, 2.5, 9, 15 mol. %, while keeping the composition of the SFP1 constant. In a second series of experiments, the concentration of EGDMA is maintained constant at 1.5 or 2.5%, while the weight fraction of PBA in the SFP1 is 0, 0.05, 0.1, and 0.2.

After mixing of 1-g portions of the mixture for the synthesis of the SFP1, a small amount of the latex dispersion was withdrawn from the flask and the morphology of latex particles are analyzed using SEM.

The weight ratio of PBA/PMMA in the CFP is about 1.5:1 and did not change in the course of the example. The average diameter of the fluid latex cores is about 420 nm and the polydispersity index measured by PCS is 0.04. The $T_g$ of the CFP in the non-coated core particles was −1.6° C.

The synthesis of rigid shells on the surface of fluid cores is studied as a function of several parameters. First, the weight ratio PBA/PMMA in the SFP1, denoted as φ, is varied from 0 to 0.25. Second, the weight ratio SFP1/CFP, designated as Φ, is varied from 0 to 2.0. Third, the extent of crosslinking of the SFP1 determined by the concentration of the cross-linking agent in the SFP1 changed from 0 to 15 mol %.

Following an increase in Φ, the mean diameter of the core-shell particles gradually increased and for Φ=2.0 reached about 620 nm, i.e., the average thickness of the SFP1 is about 55 nm. The size distribution of the core-shell particles is broader than for the core-shell particles in contrast with the composite particles with rigid cores.

To study the change in particle morphology during synthesis of the latex shells, the core-shell microspheres synthesized at different values Φ are examined with SEM.

The optimum composition of the SFP1 is one in which a rigid shell protects a fluid core from spreading on the solid substrate. This is best achieved for Φ=1.33. When SFP1 is synthesized from PMMA, the soft cores do not maintain their spherical shapes. The latex particles partly coalesce, however no complete spreading of the fluid CFP occurs on the surface of the SEM stub, and the contours of individual particles may still be resolved. A similar result is obtained when Φ=0. In contrast, when φ increases to 0.05, the shape of the individual core-shell particles becomes spherical and spreading of the CFP is suppressed, although liquid necks between the microspheres may still be resolved. Further increase in φ to 0.25 again leads to partial spreading of the CFP on the solid surface.

Following increase in Φ, the composite latex particles gradually gain a spherical shape. However, for the different values of φ, complete particle coating with the SFP1 occurs at different weight ratios SFP1/CFP. For φ=1.33 and for φ=0, the CFP leaks through the shells. For φ=0.05, the spherical core-shell particles have sharp non-sticky boundaries. For φ=0.25, the particle morphology is similar to that for φ=0. For Φ=0, all core-shell particles achieve have a spherical shape.

Two distinct glass transition temperatures are measured for the composite latex particles, which is a good indication of the core-shell structure of the latex microspheres synthesized from the slightly crosslinked CFP and SFP1.

Upon careful examination of the core-shell particles, it is found that a substantial number of the core-shell particles collapsed. This phenomenon is deliberately studied for the core-shell particles obtained at φ=0.05.

In these dispersions, two types of the co-existing collapsed microbeads are found. For Φ=1.67, i.e., in the early stages of shell synthesis, cracked particles are observed, which had approximately the same dimensions as the intact microspheres. In such particles, the cracks penetrated through the entire surface of the particles. In the later stages of the SFP1 synthesis, i.e., for Φ=2.0, a trend to "healing" of the cracks is observed: their size decreased and the inner part of the particles became less cracked. The small "scars" may be ultimately healed by synthesis of thicker rigid shells.

A second type of the collapsed core-shell particles is also noted. These particles have a significantly smaller size than the rest of the microbeads and are presumably the source of the higher polydispersity obtained for the core-shell particles.

The collapsed particles are not spherical and have a "clam" structure. The contrast between the particle contents and the shell is high, which results from the release of the fluid CFP into the surrounding medium.

The phenomenon of collapse of the latex shells is studied as a function of the extent of crosslinking of the SFP1. The concentration of the crosslinking agent in the SFP1 was varied from 0 to 1.5, 2.5, 9.0, and 15 mol %. It is found that when the concentration of EGDMA, $c_{EGDMA}$, reaches 9.0 mol %, both types of particle defects are suppressed. Particle monodispersity in this system is substantially higher than that in the latex dispersions obtained for lower $c_{EGDMA}$. Second, all composite particles have a spherical shape and their surfaces free of cracks or any other types of defects.

Another important feature observed for the varying concentration of EGDMA is the dependence of the ratio of SFP1/CFP for which the particles retained their spherical shape on the solid surface, or the extent of crosslinking. The dependence of the value of SFP1/CFP on $c_{EGDMA}$ for different compositions of the SFP is noted. When $c_{EGDMA}$ increased from 0 to 15 mol. %, the ratio SFP1/CFP decreased and the latex shells could be prepared with smaller thicknesses.

What is claimed is:

1. A method for storing information in a three dimensional optical memory storage device, comprising:
   subjecting a nanocomposite to irradiation, said nanocomposite comprising a matrix of particles of a liquid core resin surrounded by an inner shell resin and an outer shell resin, said outer shell resin forming a continuous phase of the matrix, said particles of liquid core resin containing at least one photosensitive compound and being in an array in said matrix, said continuous phase being substantially free of said photosensitive compound;
   said irradiation being selectively focused on individual particles in said array to effect photobleaching of said individual particles, said irradiation being two-photon irradiation of a wavelength to effect said photobleaching, and said irradiation being selectively focused on individual particles such that at least one particle adjacent to the selected particle in the direction of irradiation are photobleached by less than 25%.

2. The method of claim 1, in which the irradiation is a single beam of irradiation selectively focused on individual particles.

3. The method of claim 2, in which the two-photon-induced photobleaching causes each particle to perform as an individual bit.

4. The method of claim 2, in which the selected particle is photobleached by more than 50%.

5. The method of claim 2, wherein the particles of the nanocomposite have an average diameter from about 100 to about 3,000 nanometers and a polydispersity of about 1.00 to 1.10.

6. The method of claim 2, wherein the particles are present in a concentration of from about $10^{11}$ to about $10^{16}$ particles per cubic centimeter.

7. The method of claim 2, wherein the photosensitive compound is present in an amount of from about 0.015 to about 0.5 molar percent based on the total weight of the liquid core resin.

8. The method of claim 2, wherein the photosensitive compound is selected from the group consisting of photochromic, fluorescent, phosphorescent and mixtures thereof.

9. The method of claim 2, wherein the photosensitive compound is 4-amino-7-nitrobenzo-2-oxa-1,3-diazol.

10. The method of claim 1, wherein both the liquid core resin and the inner shell resin are comprised of copolymers of poly(methyl methacrylate) and poly(butyl acrylate).

11. The method of claim 10, wherein the copolymers further contain ethylene glycol dimethacrylate as a comonomer.

12. The method of claim 1, wherein the liquid core resin has a low glass transition temperature and the inner shell resin is synthesized from a rigid polymer.

13. The method of claim 1, wherein a relationship between glass transition temperatures of the liquid core resin, the inner shell resin and the outer shell resin is (liquid core resin $T_g$)<room temperature; (inner shell resin $T_g$)>(outer shell resin $T_g$)>(liquid core resin $T_g$); and (outer shell resin $T_g$)>room temperature.

14. The method of claim 1, wherein subjecting a nanocomposite to irradiation comprises said irradiation being selectively focused on individual particles such that all particles adjacent to the selected particle in the direction of irradiation are photobleached by less than 25%.

15. A method for storing information in a three dimensional optical memory storage device, the three dimensional optical memory storage device comprising a nanocomposite comprising a continuous matrix of polymer resin and a multiplicity of individual particles in an array in the continuous matrix, the individual particles comprising a liquid core resin comprising at least one photosensitive compound and surrounded by an inner shell resin and an outer shell resin, the outer shell resin forming part of the continuous matrix and being substantially free of said photosensitive compound, the method comprising:

selecting at least one individual particle of the nanocomposite; and irradiating the at least one individual particle with two-photon irradiation;

wherein, in response to the two-photon irradiation, the at least one individual particle is photobleached, and at least one individual particle adjacent to the selected at least one individual particle is photobleached by no more than about 25%.

16. The method according to claim 15, in which the selected particle is photobleached by more than 50%.

17. The method of claim 15, wherein, in response to the two-photon irradiation, all individual particles adjacent to the selected at least one individual particle are photobleached by no more than about 25%.

18. A method for storing information in a three dimensional optical memory storage device, comprising:

subjecting a nanocomposite to irradiation, said nanocomposite comprising a matrix of particles of a liquid core resin surrounded by an inner shell resin and an outer shell resin, said outer shell resin forming a continuous phase of the matrix, said particles of liquid core resin containing at least one photosensitive compound and being in an array in said matrix, said continuous phase being substantially free of said photosensitive compound;

said irradiation being selectively focused on individual particles in said array to effect photobleaching of said individual particles by not more than 50%, said irradiation being two-photon irradiation of a wavelength to effect said photobleaching.

19. A method for storing information in a three dimensional optical memory storage device, the three dimensional optical memory storage device comprising a nanocomposite comprising a continuous matrix of polymer resin and a multiplicity of individual particles in an array in the continuous matrix, the individual particles comprising a liquid core resin comprising at least one photosensitive compound and surrounded by an inner shell resin and an outer shell resin, the outer shell resin forming part of the continuous matrix and being substantially free of said photosensitive compound, the method comprising:

selecting at least one individual particle of the nanocomposite; and irradiating the at least one individual particle, with two-photon irradiation, wherein, in response to the two-photon irradiation, the at least one individual particle is photobleached by at least 50%.

* * * * *